United States Patent [19]

Helwig et al.

[11] Patent Number: 4,811,298

[45] Date of Patent: Mar. 7, 1989

[54] DECODING CIRCUIT ARRANGEMENT FOR REDUNDANT SEMICONDUCTOR STORAGE SYSTEMS

[75] Inventors: Klaus Helwig, Sindelfingen; Wolfdieter Lohlein, Herrenberg, both of Fed. Rep. of Germany; Minh H. Tong, Essex Junction, Vt.

[73] Assignee: International Business Machines Corporation, Armonk, N.Y.

[21] Appl. No.: 87,489

[22] Filed: Aug. 20, 1987

[30] Foreign Application Priority Data

Aug. 22, 1986 [EP] European Pat. Off. ......... 86111646.5

[51] Int. Cl.⁴ .............................................. G11C 13/00
[52] U.S. Cl. ..................................... 365/200; 365/96; 365/189; 365/210; 365/241
[58] Field of Search ................ 365/189, 96, 190, 210, 365/241, 200

[56] References Cited

U.S. PATENT DOCUMENTS

| | | | |
|---|---|---|---|
| 3,222,653 | 12/1965 | Rice .................... | 340/172.5 |
| 3,573,758 | 4/1971 | Henle et al. ........................ | 340/173 |
| 3,665,473 | 5/1972 | Heimbigner .................. | 340/166 FE |
| 3,753,235 | 8/1973 | Daughton et al. .............. | 340/172.5 |
| 3,753,244 | 8/1973 | Sumilas et al. ................... | 340/172.5 |
| 3,755,791 | 8/1973 | Arzubi ........................... | 340/173 R |
| 4,251,876 | 2/1981 | McKenny et al. ................. | 365/182 |
| 4,592,024 | 5/1986 | Sakai et al. .......................... | 365/200 |
| 4,737,935 | 4/1988 | Wawersig et al. .................. | 365/200 |

OTHER PUBLICATIONS

IBM Tech. Disc. Bulletin, L. M. Terman, vol. 25, No. 4, Sep. '82, pp. 2135–2136.
IBM Tech. Disc. Bulletin, H. P. Schlaeppi, vol. 7, No. 9, Feb. '65, p. 808.

*Primary Examiner*—Terrell W. Fears
*Attorney, Agent, or Firm*—Stephen J. Limanek; Mark F. Chadurjian

[57] ABSTRACT

A decoding process and a decoding circuit arrangement for a redundant semiconductor memory is described, wherein the advantages of parallelly selecting non-defective word lines and redundant word lines at a low level are utilized for the writing as well as for the reading current in such a manner that high speed reading and writing is not affected. This is achieved in that the decoder for the redundant word lines consists of a comparator circuit and fuse-controlled switches, and that the input addresses are applied to a conventional address decoder as well as to the comparator circuit. The output of the comparator circuit is directly connected to the input of a first driver circuit for the redundant word line, and furthermore to an OR circuit which is also controlled by a read/write control circuit, and which is connected to the decoder and to a clamp circuit that is directly connected to the input of a second word line driver circuit, and continuously maintains the potential following a deselect signal applied on that level, which requires a minimum of power.

10 Claims, 2 Drawing Sheets

DECODING CIRCUIT ARRANGEMENT FOR REDUNDANT SEMICONDUCTOR STORAGE SYSTEMS

TECHNICAL FIELD

This invention relates to a decoding process and circuit arrangement for semiconductor storage systems with redundant word or bit lines.

BACKGROUND ART

In the production of the monolithic integrated storage arrangements with their access circuits, as bit decoders, the reduction of power consumption is of prime importance. Originally, considerable efforts were made to reduce the power consumption of the storage cells themselves, and with the integration density increasing, it has also been attempted to cut down power consumption in the storage periphery, as, e.g., in the decoders.

To give an example: A pulse-driven decoder is known from commonly assigned U.S. Pat. No. 3,573,758, filed on Feb. 27, 1969, by R. A. Henle and W. D. Pricer, which reduces power consumption in the control as well as in the decoder circuits of the monolithic integrated storage system. This is achieved in that the decoder circuits are maintained on a minimum current level in the absence of an access to the memory. Similarly, if no information is read out of or written into the storage system, the respective current levels are kept very low. The resulting power reduction merely lies in a predetermined period of the storage system, e.g., in an access-free period. Besides, there is the added disadvantage that compared with the circuits continuously operating with full current, such a circuit is very slow. Therefore, it is not advisable to use it in modern-day monolithic storage systems whose main feature, apart from the very low power dissipation, is maximum efficiency, i.e., high-speed access and high read/write speed. For complementary metal oxide semiconductor (CMOS) storage systems, such decoders are described in, e.g., IBM Technical Disclosure Bulletin Vol. 25, No. 4, September 1982, pp. 2135, 2136. CMOS storage systems requiring a very low current are described in, e.g., U.S. Pat. No. 4,251,876, filed on Nov. 3, 1978, and in the corresponding German Offenlegungsschrift No. 2,751,481. Addressed decoder circuits with a low power consumption are also described in U.S. Pat. No. 3,665,473 filed on Dec. 18, 1970. However, these well-known decoder circuits and CMOS storage systems do not offer any solution for storage systems which for the purpose of increased reliability are equipped with redundant word and/or bit lines. Such storage systems are basically described in IBM Technical Disclosure Bulletin Vol. 7, No. 9, February 1965, page 808, and commonly assigned U.S. Pat. No. 3,222,653, filed Sept. 18, 1961 by R. Rice, and German Pat. No. 2,144,870. Although these two latter patents cover storage systems with redundant word or bit lines, the ideas presented there are not applicable to present-day storage systems because they do not include the decoders for the redundant word lines in a concept for power reduction and increased speed. Modern semiconductor memories, particularly high speed CMOS storage systems with redundant word or bit lines with a very low power dissipation necessitate the full inclusion of decoders and drivers into this concept.

DISCLOSURE OF THE INVENTION

It is, therefore, an object of the present invention to provide a method and a circuit arrangement for decoding word and/or bit lines in a CMOS semiconductor storage system with redundant word and/or bit lines, where advantages of parallel control of conventional word lines and of redundant word lines with a low level for the write or read current, respectively, are utilized in such a manner that the very fast writing or reading of the CMOS storage system is not affected thereby, and with only a small amount of circuitry being required for that purpose.

The solution as disclosed by the present invention is particularly characterized in that the concept of the parallel decoding both of the conventional word lines and of the redundant word lines is implemented in a unique manner in that stage of the storage system in which the write or read current, respectively, is at its lowest level. This ensures, on the one hand, that the redundant word lines are not selected as hitherto in a subsequent time-consuming operation, but in parallel to the selection of the conventional word lines. Furthermore, this solution ensures the minimum extent of power dissipation. Such a combination is achieved in particular by the arrangement of a direct addressed connection via fuse-controlled switches, and in that all word or bit lines of the storage system simultaneously remain in an unselected state through a clamp circuit. This clamp circuit is provided at the output of the address decoder directly preceding the driver states. The clamp circuit continues to be used for deactivating the address decoder and for initiating a restore operation of the address decoder so that the latter is again ready for use immediately.

The foregoing and other objects, features and advantages of the invention will be apparent from the following more particular description of the preferred embodiments of the invention, as illustrated in the accompanying drawings.

BRIEF DESCRIPTION OF THE DRAWINGS

FIG. 1 shows a block circuit diagram using known methods for, e.g., CMOS storage systems for address decoding by providing several partial decoder stages. As shown in FIG. 1, a word line WL is selected via a pre-decoder 1 and a decoder 2. For that purpose, addresses A are applied to address line 3 and reach in parallel one of the inputs of a comparator circuit 4. In other words, the addresses which are applied to pre-decoder 1 are also applied in parallel to comparator circuit 4 to which fuse addresses FA are applied. The fuses have been set so as to replace a defective word or bit line by a corresponding redundant line. This operation is known and, therefore, not the subject of the present invention. In case of a conventional selection of the word line WL, no match signal is generated at output 5 of comparator circuit 4, so that a DESELECT signal at output 6 of an OR circuit 7 is set to 0 volts. Through this operation of the circuit, a clamp circuit 8 comprising a field effect transistor is switched off and a decoded address can thus reach from an output 9 of the decoder 2 to a series-arranged driver circuit 10. Now, driver circuit 10 in turn raises the potential of its associated word line WL.

Figure 2:
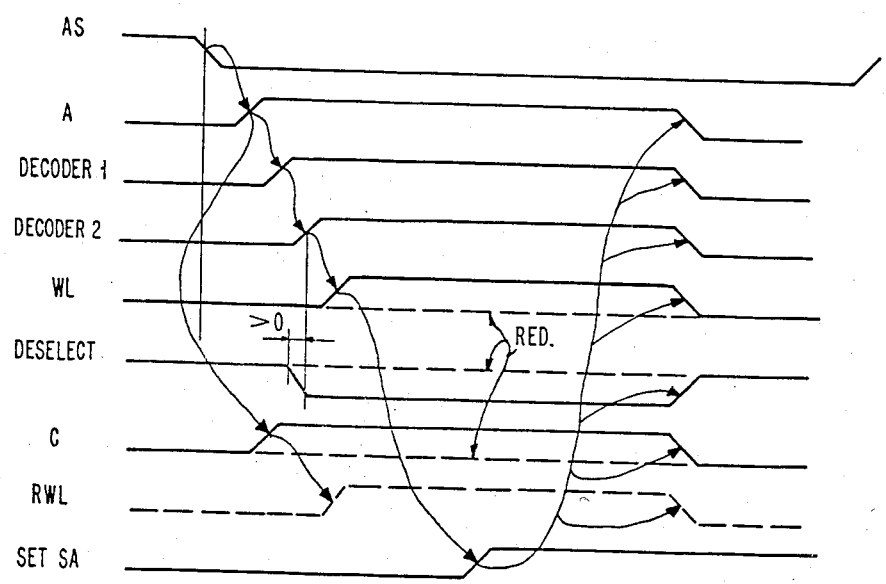
FIG. 2 is a time diagram for the circuits illustrated in FIGS. 1 and 3.

Since the comparison between applied address and fuse address in the present circuit is always implemented at an early stage, the DESELECT signal reaches the decoder output in valid form always prior to the output signal from the decoder owing at the low number of switching stages, so that the conventional decoder part is not influenced (see also the time diagram of FIG. 2). When a redundant word line RWL is to be activated, this activation is preceded by a match signal at output 5 of the comparator circuit 4. Through the match signal, the corresponding redundant word line RWL is directly activated via the driver circuit 11 connected thereto. In other words, there is no loss of time in the selection of the redundant word line RWL. Another important feature consists in that the DESELECT signal remains high, so that a decoded word address cannot address the corresponding defective word line WL at the output of clamp circuit 8. Since, as mentioned above, the path via comparator circuit 4 to the redundant word line RWL operates at a much higher speed, the consequence is that in the activation of a redundant word line RWL, the line is activated even earlier, which advantageously influences the storage access time to the effect that it operates at a very high speed. At the same time, an active DESELECT signal initiates a restore process at the address decoder of the present storage system, so that the clamp process and consequently the necessary power is limited to a minimum. As clamp circuit 8 is controlled by the output of OR circuit 7 having one input 13 controlled by read-/write control circuit 12, this clamp circuit 8 can switch off a word line WL, the switching-off being controlled by a read/write signal R/W used to, e.g., read a cell located at the intersection of the word line WL and a bit line, not shown. After the read process, a signal derived from SET SA, in FIG. 2, and a read/write signal in circuit 12 is used via the OR circuit 7 to switch off the active word line WL. With this approach, the word line WL is switched off immediately after the read process is completed with the advantage being that the bit lines are not discharged to ground by an otherwise continuously active word line WL. Therefore, only minimal power for precharging the bit lines is required. Signal SET SA (FIG. 2) of a read or sense amplifier SA reactivates all signals, as indicated in the pulse diagram in accordance with FIG. 2, and initiates the conventional restore process. For a writing process, the corresponding bit line has to be pulled down to 0 volts, so that the word line WL is switched off only later.

In the following, a detailed circuit of the present invention according to FIG. 3 will be described which is a modification of the circuit or system of FIG. 1 of the drawings. The word line decoding is affected via an XY matrix. For a better understanding, a version for a total of four addresses is depicted. Only the transistors T1, T2, T3 and T7, T8, T9 for the address combination are shown; all complementary address signals A1C to A4C are on, a "1". The word line WL is selected when the signals A1C to A4C are on, "1", and when the start signal SWD setting the word decoder is available from a time signal chain of the storage system.

Figure 3:
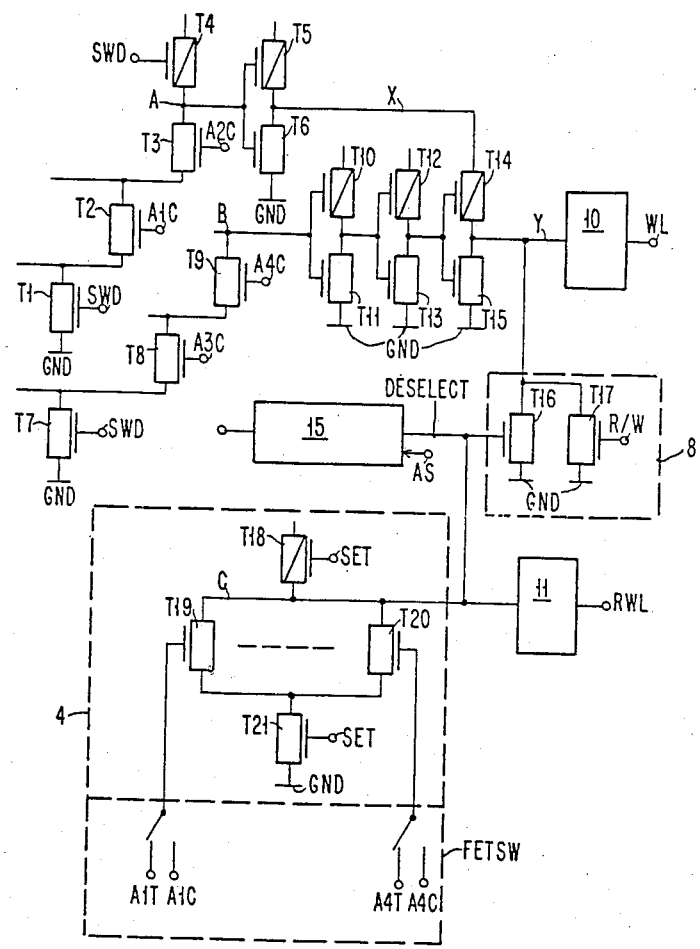
FIG. 3 is a detailed circuit diagram of a modification of the storage system of FIG. 1.

Subsequently, node A in FIG. 3 is discharged, and signal X on the common output of transistor T5 and transistor T6 rises. Simultaneously, node B is discharged, too, which is provided at the output of transistor T9 so that the gate electrode voltage of transistor T14, which is controlled via the additional inverter transistors T12 and T13, goes to ground GND. Transistor T14 now tends to raise node Y high.

Figure 1:
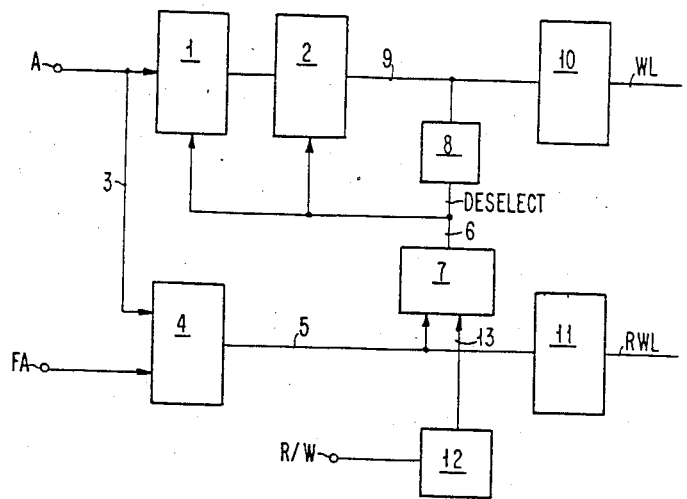
FIG. 1 is a block diagram of a storage system which includes the decoding system and circuit in accordance with the present invention.

In this circuit, the redundant path is represented by transistors T18 through T21 which substantially correspond to comparator circuit 4 in FIG. 1. The real or the complementary signals, respectively, for the addresses are guided via the fuse-programmed field effect transistor switches FET SW, so that there follows an extremely short delay with subsequent application to a high-speed NOR stage of transistors T18 to T21. This NOR stage is applied with a signal SET which is equally taken from the time pulse chain of the storage system and is activated simultaneously or sooner than the control signal SWD. Due to this fact, a word line WL can be selected only if the clamp circuit 8 consisting of transistors T16 and T17 has been released. If comparator circuit 4 does not comprise a "match" signal, nod C in FIG. 3 is discharged, so that transistor T16 of the clamp circuit 8 releases word line WL via driver 10. If there is a "match" signal transistors T19 to T20 are all switched off, and node C is not discharged. Thus, the corresponding word line WL is fixed at its potential, and the corresponding redundant word line RWL can be activated via driver circuit 11. By means of transistor T17, word line WL can be switched off, also, so that by controlling with a read/write control signal R/W of FIG. 3 a power reduction can be achieved. With the signal DESELECT at node C, the signal SWD can be turned off early, too, so that the decoder executes a restore operation controlled by a restore generator 15 for resetting the word decoders (1 and 2 of FIG. 1). Due to the early switch off of word line WL controlled by signals R/W, AS and SET SA, which are applied to restore generator 15, the power dissipation of the array is drastically reduced. The signal for the storage array selection AS triggers the corresponding word line WL so that the bit line begins to discharge. As soon as 0.1 volts to approximately 0.5 volts has been reached, an associated read amplifier (not shown) is set. The read amplifier simultaneously has to insulate the bit lines of the data path. If a read process is involved, word line WL can be switched off at this time. This also means that the potential of the bit line is no longer discharged via the storage cell, i.e., it has been reduced by 0.5 volts only, which means that in the restore operation, it has to be increased by 0.5 volts only so that a considerable amount of power is saved. As indicated above, the circuit described is merely an embodiment, so that modifications of this embodiment can be made without departing from the principle of the present invention.

While the invention has been particularly shown and described with reference to preferred embodiments thereof, it will be understood by those skilled in the art that various changes in form and details may be made therein without departing from the spirit and scope of the invention.

What is claimed is:
1. A circuit arrangement comprising
decoding means having input and output,
comparator means,
means for storing defective addresses coupled to said comparator means,
a memory having a given conductive address line coupled to the output of said decoding means and a redundant address line coupled to the output of said comparator means, and address means, said address means applying address signals simultaneously to the input of said decoding means and to said comparator means, the output of said comparator means being further coupled to the output of said decoding means.

2. A circuit arrangement as set forth in claim 1 further including a clamping circuit having an output connected to the output of said decoding means, the output of said comparator means being coupled to the output of said decoding means through said clamping circuit.

3. A circuit as set forth in claim 1 wherein the output of said comparator means is coupled to control said decoding means.

4. A circuit as set forth in claim 1 further including first and second driver circuits, said given conductive address line being coupled to said decoding means through said first driver circuit and said redundant address line being coupled to the output of said comparator means through said second driver circuit.

5. A circuit arrangement as set forth in claim 1 wherein said comparator means includes fewer stages than the number of stages in said decoding means.

6. A circuit arrangement as set forth in claim 1 wherein said mans for storing a defective address includes a plurality of selectively blown fuses.

7. A circuit arrangement as set forth in claim 1 wherein said given conductive address line is a memory word line and further including read/write control means for providing a restore signal having an output coupled to the output of said decoding means.

8. A circuit arrangement comprising decoding means having input and output, comparator means, means for storing defective addresses coupled to said comparator means, a memory word line coupled to the output of said decoding means, a redundant word line coupled to the output of said comparator means, read/write control means for providing a restore signal having an output coupled to the output of said decoding means, a clamping circuit having an output connected to the output of said decoding means, the output of said read/write control means being coupled to the output of said decoding means through said clamping circuit, and address means, said address means applying address signals simultaneously to the input of said decoding means and to said comparator means, the output of said comparator means being further coupled to the output of said decoding means.

9. A circuit arrangement as set forth in claim 8 further including an OR circuit having an output connected to the input of said clamping circuit and first and second inputs, the output of said comparator means being connected to the first input of said OR circuit and the output of said read/write control means being connected to the second input of said OR circuit.

10. A circuit arrangement as set forth in claim 9, further including first and second driver circuits, said word line being coupled to said decoding means through said first driver circuit and said redundant line being coupled to the output of said comparator means through said second driver circuit.

* * * * *